(12) United States Patent
Hara et al.

(10) Patent No.: US 6,910,172 B2
(45) Date of Patent: Jun. 21, 2005

(54) CRC ENCODING CIRCUIT, CRC ENCODING METHOD, DATA SENDING DEVICE AND DATA RECEIVING DEVICE

(75) Inventors: Kiyomi Hara, Tokyo (JP); Takao Inoue, Tokyo (JP)

(73) Assignee: Yokogawa Electric Corporation, Tokyo (JP)

(*) Notice: Subject to any disclaimer, the term of this patent is extended or adjusted under 35 U.S.C. 154(b) by 576 days.

(21) Appl. No.: 09/987,717

(22) Filed: Nov. 15, 2001

(65) Prior Publication Data

US 2002/0066059 A1 May 30, 2002

(30) Foreign Application Priority Data

Nov. 27, 2000 (JP) ........................................ 2000-359827

(51) Int. Cl.⁷ .......................................... H03M 13/00
(52) U.S. Cl. ...................................................... 714/757
(58) Field of Search .............................. 714/757, 758, 714/752, 807

(56) References Cited

U.S. PATENT DOCUMENTS

| 3,678,469 | A | * | 7/1972 | Freeman et al. | ............. 714/779 |
| 5,870,143 | A | * | 2/1999 | Suzuki | .................. 348/333.02 |
| 6,128,766 | A | * | 10/2000 | Fahmi et al. | ................ 714/807 |
| 6,701,479 | B2 | * | 3/2004 | Keller | ......................... 714/757 |

* cited by examiner

*Primary Examiner*—Shelly A Chase
(74) *Attorney, Agent, or Firm*—Oliff & Berridge, PLC

(57) ABSTRACT

A CRC encoding circuit for generating a CRC code in accordance with a parallel data having a remainder portion data in a last data set of the parallel data, comprises: a first encoding unit for generating one or more first CRC codes in parallel in accordance with the remainder portion data; a CRC code selecting unit for selecting a second CRC code having predetermined number of bytes, from the first CRC codes generated by the first encoding unit; a converting unit for converting the remainder portion data into a serial data; and a second encoding unit for generating a third CRC code in accordance with the second CRC code selected by the CRC code selecting unit and the serial data converted by the converting unit.

16 Claims, 3 Drawing Sheets

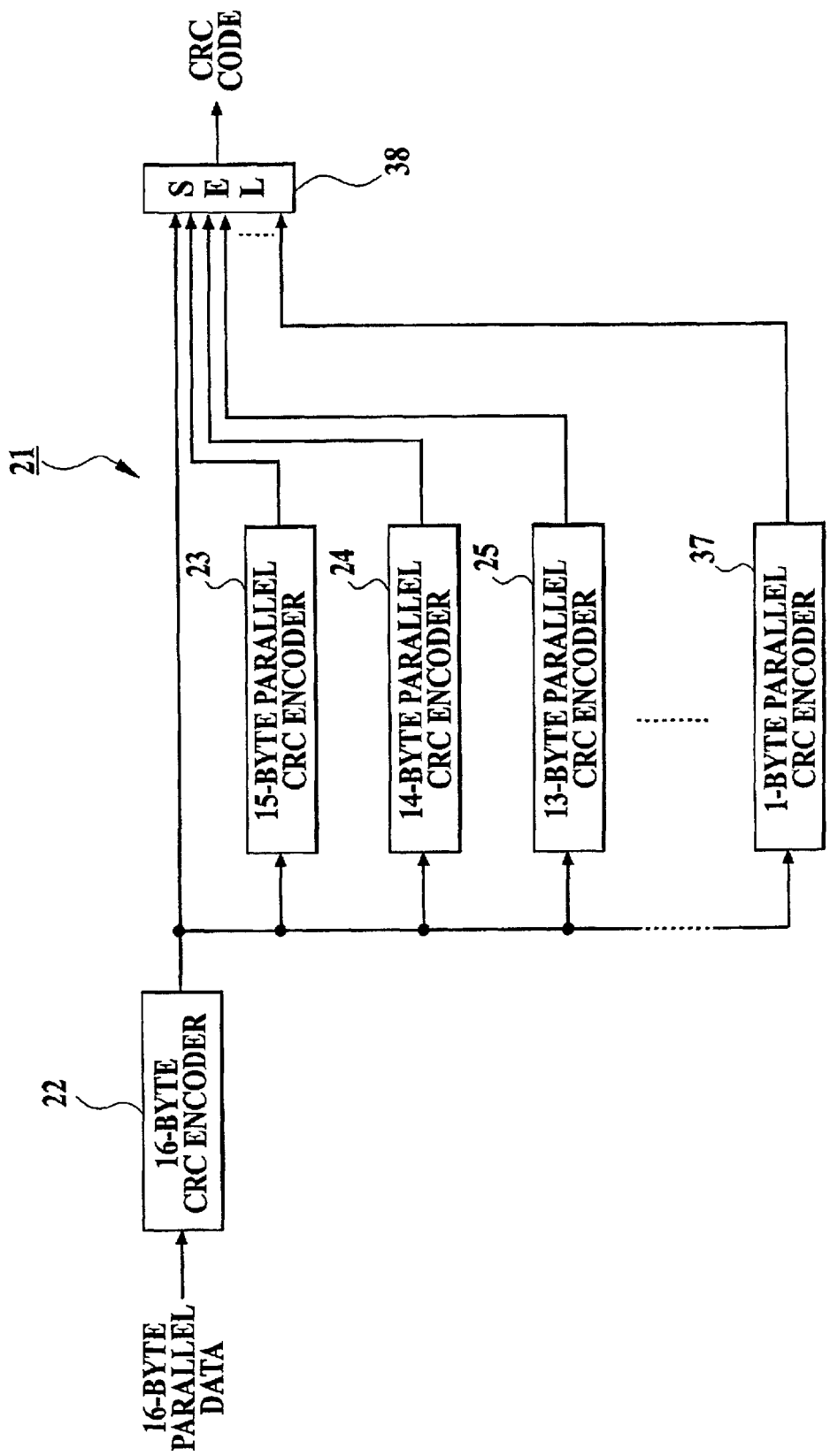

US 6,910,172 B2

CRC ENCODING CIRCUIT, CRC ENCODING METHOD, DATA SENDING DEVICE AND DATA RECEIVING DEVICE

BACKGROUND OF THE INVENTION

1. Field of the Invention

The present invention relates to a CRC encoding circuit for generating a CRC code from parallel data which are input as variable-length data having a remainder portion in the last parallel data set, and to a CRC encoding method therefor. Further, the present invention relates to a data sending device and a data receiving device for detecting an error of data in the data communication by using the CRC encoding circuit.

2. Description of Related Art

According to an earlier development, a CRC (Cyclic Redundancy Check) which has high ability to detect an error in a digital communication, is used. The CRC means an error detection method for detecting an error of data by making a comparison between the CRC code generated in a sender and the CRC code generated in a receiver.

Recently, for example, like POS (PPP Over SONET/SDH), the high-speed variable-length data communication which performs communication from end to end by framing a low-speed variable-length data frame (PPP frame) over a high-speed variable-length data frame (SONET/SDH frame), is utilized widely. A CRC encoding circuit which generates a CRC code in accordance with the inputted n-byte parallel data, has been introduced as means for detecting an error of data in such high-speed variable-length data communication.

Hereinafter, a former CRC encoder will be explained with reference to FIG. 3.

FIG. 3 shows circuit composition of a CRC encoding circuit 21. As shown in FIG. 3, a CRC encoding circuit 21 mainly comprises a 16-bytes parallel CRC encoder 22, each n-byte parallel CRC encoder 23 to 37 (n=1 to 15), and a selector (SEL) 38.

In the 16-bytes parallel data outputted from an external circuit, the parallel data other than the remainder portion data of the last parallel data set is encoded by the 16-bytes parallel CRC encoder 22. As a result, a CRC code is outputted as an encoded interim result. On the other hand, the remainder portion data of the last parallel data set is encoded by any one of the n-byte parallel CRC encoders corresponding to the number of the byte(s) of the inputted remainder portion data, in accordance with the encoded interim result, and then is outputted to the SEL 38. The SEL 38 selects the desired CRC code from the inputted plurality of CRC codes, and outputs the desired CRC code as a final encoded result.

Although the above-mentioned CRC encoding circuits 21 was useful as a remedy for processing less than 16 bytes of data, there was the following problem. For example, variable-length data is 16-bytes data, a total of 16 n-byte parallel CRC encoders including the CRC encoder(s) which is not actually used, are required. Thus, a total of $4^n-1$ byte(s) parallel CRC encoders are required as the number of bytes of the inputted $4^n$-byte parallel data increases. Therefore, the manufacturing costs of the CRC encoding circuit increases with the circuit scale of the CRC encoding circuit.

SUMMARY OF THE INVENTION

An object of the present invention is to provide a CRC encoding circuit and a CRC encoding method which can suppress the number of the CRC encoders to be used and generate a CRC code in accordance with $4^n$-byte parallel data inputted in sequential order as variable-length data.

In order to solve the above problem, in accordance with a first aspect of the invention, a CRC encoding circuit for generating a CRC code in accordance with a parallel data having a remainder portion data in a last data set of the parallel data, comprises:

a first encoding unit for generating one or more first CRC codes in parallel in accordance with the remainder portion data;

a CRC code selecting unit for selecting a second CRC code having predetermined number of bytes, from the first CRC codes generated by the first encoding unit;

a converting unit for converting the remainder portion data into a serial data; and a second encoding unit for generating a third CRC code in accordance with the second CRC code selected by the CRC code selecting unit and the serial data converted by the converting unit.

The parallel data may be a $4^n$-byte parallel data and the predetermined number may be $4^{n-m}$, where n is a natural number and m is a natural number selected from 1 to n. The converting unit may convert the remainder portion data into a 4-byte serial data.

The CRC encoding circuit may further comprise:

a detecting unit for detecting the remainder portion data from the last data set of the parallel data; and wherein the converting unit converts the remainder portion data which is detected by the detecting unit, into a $4^{n-m}$-byte serial data, where n is a natural number and m is a natural number selected from 1 to n.

The parallel data may be a variable-length data.

In accordance with a second aspect of the invention, a CRC encoding method for generating a CRC code in accordance with a parallel data having a remainder portion data in a last data set of the parallel data, comprises the steps of:

generating one or more first CRC codes in parallel in accordance with the remainder portion data;

selecting a second CRC code having predetermined number of bytes, from the first CRC codes;

converting the remainder portion of the parallel data into a serial data; and generating a third CRC code in accordance with the second CRC code and the serial data.

The parallel data may be a $4^n$-byte parallel data, and the predetermined number may be $4^{n-m}$, where n is a natural number and m is a natural number selected from 1 to n. The serial data may be a 4-byte serial data.

The CRC encoding method may further comprise the step of:

detecting the remainder potion data from the last data set of the parallel data;

wherein the remainder portion data is converted into a $4^{n-m}$-byte serial data, where n is a natural number and m is a natural number selected from 1 to n.

The parallel data may be a variable-length data.

In accordance with a third aspect of the invention, a data sending device comprises:

a CRC encoding circuit for generating a CRC code in accordance with a parallel data having a remainder portion data in a last data set of the parallel data, comprising: a first encoding unit for generating one or more first CRC codes in parallel in accordance with the remainder portion data; a CRC code selecting unit for selecting a second CRC code having predetermined number of bytes, from the first CRC codes generated by the first encoding unit; a converting unit for converting the remainder portion data into a serial data; and a second encoding unit for generating a third CRC code in accordance with the second CRC code selected by the selecting unit and the serial data converted by the converting unit.

The parallel data may be a $4^n$-byte parallel data, and the predetermined number may be $4^{n-m}$, where n is a natural number and m is a natural number selected from 1 to n. The converting unit may convert the remainder portion data into a 4-byte serial data.

The data sending device may further comprise:

a detecting unit for detecting the remainder portion data from the last data set of the parallel data;

wherein the converting unit converts the remainder portion data which is detected by the detecting unit, into a $4^{n-m}$-byte serial data, where n is a natural number and m is a natural number selected from 1 to n.

The parallel data may be a variable-length data.

In accordance with a fourth aspect of the invention, a data receiving device comprises:

a CRC encoding circuit for generating a CRC code in accordance with a parallel data having a remainder portion data in a last data set of the parallel data, comprising: a first encoding unit for generating one or more first CRC codes in parallel in accordance with the remainder portion data; a CRC code selecting unit for selecting a second CRC code having predetermined number of bytes, from the first CRC codes generated by the first encoding unit; a converting unit for converting the remainder portion data into a serial data; and a second encoding unit for generating a third CRC code in accordance with the second CRC code selected by the selecting unit and the serial data converted by the converting unit.

The parallel data may be a $4^n$-byte parallel data, and the predetermined number may be $4^{n-m}$, where n is a natural number and m is a natural number selected from 1 to n. The converting unit may convert the remainder portion data into a 4-byte serial data.

The data receiving device may further comprise:

a detecting unit for detecting the remainder portion data from the last data set of the parallel data;

wherein the converting unit converts the remainder portion data which is detected by the detecting unit, into a $4^{n-m}$-byte serial data, where n is a natural number and m is a natural number selected from 1 to n.

The parallel data may be a variable-length data.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein;

FIG. 3 is a circuit block diagram showing a CRC encoding circuit according to an earlier development.

PREFERRED EMBODIMENT OF THE INVENTION

Figure 1:
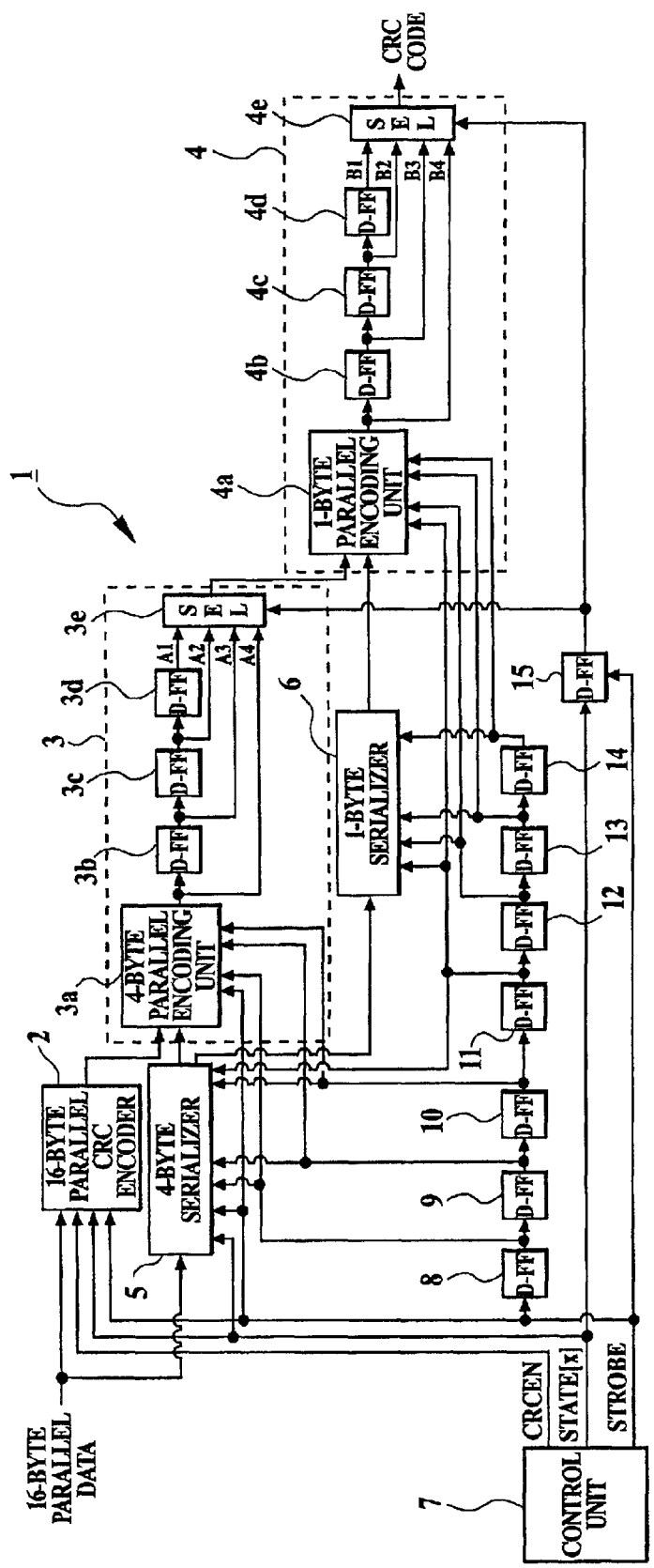
FIG. 1A is a circuit block diagram showing the CRC encoding circuit 1 to which the present invention is applied.
FIG. 1B is a view showing the relation between the number of bytes of the remainder portion of 16-byte parallel data and the initial value to be selected by the SEL 3e and the SEL 4e of the CRC encoding circuit 1.

Hereinbelow, the CRC encoding circuit 1 to which the present invention is applied will be explained with reference to the drawings.

For the purpose of simplifying the explanation, the case that a CRC code is generated in accordance with the 16-byte parallel data having a remainder portion which is 15 bytes of data "33" to "47" in the last parallel data set (see "D3" in FIG. 2), will be explained in this embodiment of the invention.

At first, the construction of the CRC encoding circuit 1 will be explained.

As shown in FIG. 1A, the CRC encoding circuit 1 mainly comprises a 16-byte parallel CRC encoder 2, a 4-byte parallel CRC encoder 3, a 1-byte parallel CRC encoder 4, a 4-byte serializer 5, a 1-byte serializer 6, a control unit 7 and eight D-FFs (Delay Flip Flop) 8 to 15.

When the 16-byte parallel data which is a variable-length data and is output from an external circuit which is not shown in the figures, is 16 or more bytes of data, the 16-byte parallel CRC encoder 2 encodes the input data by 16 bytes (see "D1" and "D2" in FIG. 2) to a CRC code except the remainder portion of the 16-byte parallel data (see "D3" in FIG. 2) on the basis of an initial value, according to the control timing signal which is output from the control unit 7. When the 16-byte parallel CRC encoder 2 encodes the second or a later parallel data set of the 16-byte parallel data to a CRC code, a CRC code generated by the last encoding is used as an initial value. Then, the 16-byte parallel CRC encoder 2 outputs the encoded interim result "A" to the 4-byte parallel CRC encoder 3. When the input variable-length parallel data is less than 16 bytes of data, that is, when the input parallel data is only the remainder portion of the 16-byte parallel data, the 16-byte parallel CRC encoder 2 outputs the initial value to the 4-byte parallel CRC encoder 3 without encoding the input parallel data to a CRC code.

The 4-byte parallel CRC encoder 3 comprises a 4-byte parallel encoding unit 3a, three D-FFs 3b, 3c and 3d, and a SEL (selector) 3e. The 4-byte parallel CRC encoder 3 encodes the 4-byte serial data output from the 4-byte serializer 5, to a CRC code with the 4-byte parallel encoding unit 3a by using an initial value, in accordance with the control timing signals which are output from the control unit 7 and the D-FFs 8, 9, and 10. When, the 4-byte parallel CRC encoding unit 3a encodes the first serial data set of 4-byte serial data which is serialized by the 4-byte serializer 5, to a CRC code, the encoded interim result "A" which is output from the 16-byte parallel CRC encoder 2, is used as an initial value. When the 4-byte parallel CRC encoding unit 3a encodes the second or later serial data set of 4-byte serial data which is serialized by the 4-byte serializer 5, to a CRC code, a CRC code generated by the last encoding of the 4-byte parallel CRC encoding unit 3a is used as an initial value.

In the generated CRC codes, the CRC code corresponding to the data "1" to "32" of the 16-byte parallel data (see "D1" and "D2" in FIG. 2), which are shifted by the D-FFs 3b, 3c and 3d, is input into the SEL 3e as an initial value "A1". Similarly, a CRC code corresponding to the data "1" to "36" (see "D1" to "D3" in FIG. 2) of the 16-byte parallel data, which are shifted by the D-FFs 3b and 3c, is input into the SEL 3e as an initial value "A2". Moreover, a CRC code corresponding to the data "1" to "40" of the 16-byte parallel data, which are shifted by the D-FF 3b, is input into the SEL 3e as an initial value "A3". Furthermore, a CRC code corresponding to the data "1" to "44" of the 16-byte parallel data, is input into the SEL 3e as an initial value "A4". After one initial value is selected from the four input initial values "A1" to "A4" by the SEL 3e, according to the STATE [X] signal which will be explained below (see the relation between the initial value selected by the SEL 3e and the number of bytes of the remainder portion, which is shown in FIG. 1B), the selected initial value is output to the 1-byte parallel CRC encoder 4 as an encoded interim result "B".

The 1-byte parallel CRC encoder 4 comprises a 1-byte parallel encoding unit 4a, three D-FFs 4b, 4c and 4d, and a SEL (selector) 4e. The 1-byte parallel CRC encoder 4 encodes 1-byte serial data output from the 1-byte serializer 6, to a CRC code with the 1-byte parallel encoding unit 4a by using an initial value, in accordance with the control timing signals which are generated by the control unit 7 and are output from the D-FFs 11, 12, 13 and 14. When the 1-byte parallel CRC encoding unit 4a encodes the first serial data set of 1-byte serial data which is serialized by the 1-byte serializer 6, the encoded interim result "B" which is output from the 4-byte parallel CRC encoder 3, is used as an initial value. When the 1-byte parallel CRC encoding unit 4a encodes the second or later serial data set which is serialized by 1-byte serializer 6, to a CRC code, a CRC code generated by the last encoding of the 1-byte parallel CRC encoding unit 4a is used as an initial value.

In the generated CRC codes, the CRC code corresponding to the data "1" to "44" of the 16-byte parallel data, which are shifted by the D-FFs 4b, 4c and 4d, is input into the SEL 4e as an initial value "B1". Similarly, a CRC code corresponding to the data "1" to "45" (see "D3" in FIG. 2) of the 16-byte parallel data, which are shifted by the D-FFs 4b and 4c, is input into the SEL 4e as an initial value "B2". Moreover, a CRC code corresponding to the data "1" to "46" of the 16-byte parallel data, which are shifted by the D-FF 4b, is input into the SEL 4e as an initial value "B3". Furthermore, a CRC code corresponding to the data "1" to "47" of the 16-byte parallel data, is input into the SEL 4e as an initial value "B4". After one initial value is selected from the four initial values "B1" to "B4" which are input into the SEL 4e by the SEL 4e, according to the STATE [X] signal which will be explained below (see the relation between the CRC code selected by the SEL 4e and the number of bytes of the remainder portion, which is shown in FIG. 1B), the selected CRC code is output by the SEL 4e as a final encoded result.

The 4-byte serializer 5 converts the last parallel data set (unencoded data) of the 16-byte parallel data which is output from an external circuit which is not shown in the figures, into three 4-byte serial data ("a", "b" and "c") according to the control timing signals which are output from the control unit 7, the D-FFs 8, 9 and 10. Here, the serial data "a" corresponds to the data "33" to "36" of the last parallel data set. The serial data "b" corresponds to the data "37" to "40" of the last parallel data set. The serial data "c" corresponds to the data "41" to "44" of the last parallel data set. Then, the 4-byte serializer 5 outputs these three serial data to the 4-byte parallel encoding unit 3a in order of "a", "b" and "c" according to the control timing signals which are output from the control unit 7, the D-FFs 8, 9 and 10. Moreover, in accordance with the value of the STATE [x] signal, the 4-byte serializer 5 outputs the 3-byte data, that is, the data "33" to "35" (when x is 1 to 4), the data "37" to "39" (when x is 5 to 8) or the data "41" to "43" (when x is 13 to 16) of the last parallel data set, to the 1-byte serializer 6.

Similarly, the 1-byte serializer 6 converts the unencoded remainder data "45", "46" and "47" of the last parallel data set, which are output from the 4-byte serializer 5, into 1-byte serial data, according to the control timing signals which are output from the D-FFs 11, 12, 13 and 14. Then, the 1-byte serializer 6 outputs these three serial data to the 1-byte parallel encoding unit 4a in order of "45", "46" and "47" according to the control timing signals which are output from the D-FFs 11, 12, 13 and 14.

The control unit 7 detects the data which are in the last parallel data set (the remainder portion) of the input 16-byte parallel data, and the number of bytes "x" of the remainder portion data. Moreover, the control unit 7 outputs various control timing signals (the various control signals which will be explained below). Moreover, the control unit 7 carries out the control for generating a CRC code from the 16-byte parallel data which is input into the CRC encoding circuit 1.

The D-FFs 9 to 15 sequentially shift the STROBE signal which is output from the control unit 7, and output the STROBE signal to the next D-FF and each circuit.

Here, the 16-byte parallel data to be encoded to a CRC code, and the various control signals (that is, a CRCEN signal, a STROBE signal and a STATE [x] signal shown in FIG. 1), which are output by the control unit 7, will be explained.

The 16-byte parallel data is communication data having a variable-length data frame. The 16-byte parallel data is input into the 16-byte parallel CRC encoder 2 and the 4-byte serializer 5.

The CRCEN (CRC ENABLE) signal is one for indicating the range of the data to be encoded to a CRC code. The CRCEN signal is input only into the 16-byte parallel CRC encoder 2.

The STROBE signal is one for indicating whether the input data is the last parallel data set the 16-byte parallel data. The STROBE signal is input into the 16-byte parallel CRC encoder 2, the 4-byte parallel CRC encoder 3, the 4-byte serializer 5 and the D-FFs 8 and 15.

The STATE [x] signal is one for indicating the number of bytes of the last parallel data set of the 16-byte parallel data which is indicated by the STROBE signal. The STATE [x] signal is input into the 16-byte parallel CRC encoder 2, the 4-byte serializer 5 and the D-FF 15.

Secondly, the CRC encoding operation for generating a CRC code from the 16-byte parallel data will be explained in view of FIG. 2.

Figure 2:
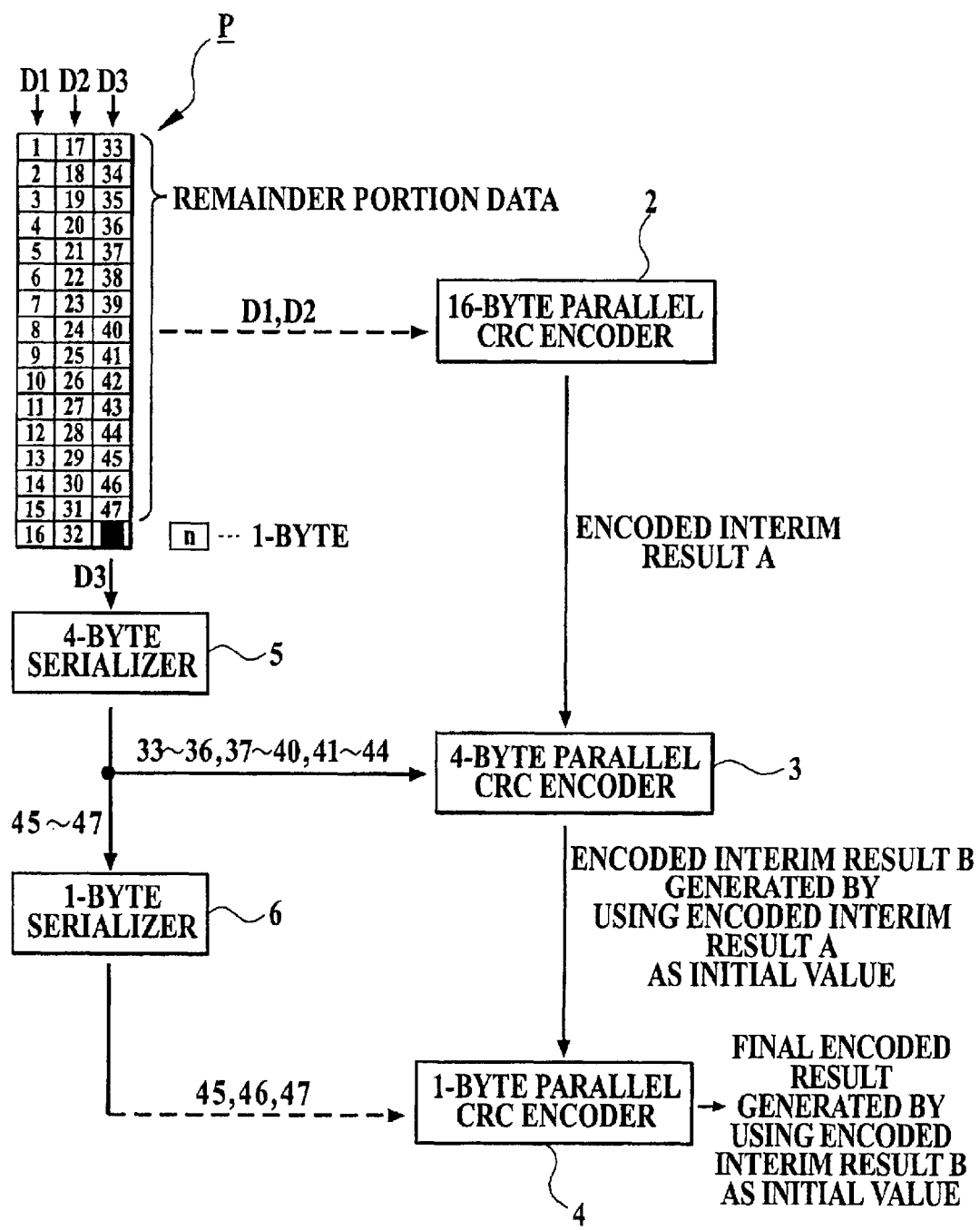
FIG. 2 is a view showing the process of generating a CRC code in accordance with 16-byte parallel data having the remainder portion by the CRC encoding circuit 1 in FIG. 1A.

As shown in FIG. 2, the 16-byte parallel data "P" having 47 bytes of frame length ("1" to "47") comprises three sets of parallel data "D1" ("1" to "16"), "D2" ("17" to "32") and "D3" ("33" to "47"). The parallel data of the last parallel data set "D3" has 15 bytes of remainder portion data "33" to "47", and 1 byte of ineffective data (which is shown by a dotted area in FIG. 2).

The data "D1" and "D2" of the 16-byte parallel data "P" are input into the 16-byte parallel CRC encoder 2. Then, the 16-byte parallel CRC encoder 2 encodes the input 16-byte parallel data "D1" and "D2" to a CRC code, and outputs the result of the encoding as the encoded interim result "A" to the 4-byte parallel CRC encoder 3. Here, the encoded interim result "A" is the result of the encoding of the data "D2", by using a CRC code which is generated by the encoding of the data "D1", as an initial value.

The upper 12 bytes data ("33" to "44") of the data "D3" of the 16-byte parallel data "P" is converted into the three 4-byte serial data sets ("33" to "36", "37" to "40" and "41"

to "44") by the 4-byte serializer 5. Then, the three 4-byte serial data sets are input into the 4-byte parallel CRC encoder 3. The input first 4-byte serial data set "33" to "36" is encoded to a CRC code by the 4-byte parallel CRC encoding unit 3a by using the encoded interim result "A" as an initial value. The input second 4-byte serial data set "37" to "40" is encoded to a CRC code by the 4-byte parallel CRC encoding unit 3a by using a CRC code generated by encoding the first 4-byte serial data set "33" to "36" as an initial value. The input third 4-byte serial data set "41" to "44" is encoded to a CRC code by the 4-byte parallel CRC encoding unit 3a by using a CRC code generated by encoding the second 4-byte serial data set "37" to "40" as an initial value. Then, the generated CRC code is output to the 1-byte parallel CRC encoder 4 as the encoded interim result "B".

On the other hand, the lower 3 bytes data ("45" to "47") of the data "D3" of the 16-byte parallel data "P" is converted into the three 1-byte serial data sets ("45", "46" and "47") by the 1-byte serializer 6. Then, the three 1-byte serial data sets are input into the 1-byte parallel CRC encoder 4. The input first 1-byte serial data set "45" is encoded to a CRC code by the 1-byte parallel CRC encoding unit 4a by using the encoded interim result "B" as an initial value. The input second 1-byte serial data set "46" is encoded to a CRC code by the 1-byte parallel CRC encoding unit 4a by using a CRC code generated by encoding the first 1-byte serial data set "45", as an initial value. The input third 1-byte serial data set "47" is encoded to a CRC code by the 1-byte parallel CRC encoding unit 4a by using a CRC code generated by encoding the second 1-byte serial data set "46", as an initial value. Then, the generated CRC code is output as the final encoded result.

Although the case where the remainder portion of the 16-byte parallel data is 15 bytes of data, is explained in this embodiment, the number of bytes of the remainder portion in the last parallel data set may be optional. For example, as shown in FIG. 1B, when the remainder portion of the last parallel data set is 1 to 3 or 16 byte(s) of data, the SEL 3e selects "A1". When the remainder portion of the last parallel data set is 4 to 7 bytes of data, the SEL 3e selects "A2". When the remainder portion of the last parallel data set is 8 to 11 bytes of data, the SEL 3e selects "A3". When the remainder portion of the last parallel data set is 12 to 15 bytes of data, the SEL 3e selects "A4". Moreover, in case that a remainder is 0 when the number of bytes of the remainder portion data in the last parallel data set is divided by 4, the SEL 4e selects "B1". When the remainder is 1, the SEL 4e selects "B2". When the remainder is 2, the SEL 4e selects "B3". When the remainder is 3, the SEL 4e selects "B4".

As mentioned above, because the CRC encoding circuit 1 in accordance with the present invention comprises n of CRC encoders as well as a $4^n$-byte parallel CRC encoder for encoding a $4^{n-m}$ (m=1 to n)-byte parallel data, when the CRC encoding circuit 1 encodes a $4^n$-byte parallel data to a CRC code, the CRC encoding circuit 1 has the function that the remainder portion data in a last parallel data set of the bytes parallel data "P" which is inputted as variable-length data can be encoded and sequentially processed in accordance with a CRC codes encoded by a CRC encoder.

Thus, even when the parallel data having a great data width, such as 16-bytes parallel data, is inputted into the CRC encoding circuit 1, the CRC code of the inputted parallel data can be generated by using simple circuit composition. This can suppress the increase in circuit scale of the CRC encoding circuit and in manufacturing cost thereof.

Furthermore, at most, n+1 of byte(s) parallel CRC encoders are sufficient for $4^n$-byte parallel data which is input, in the CRC encoding circuit of the present invention. Thus, even when 4 bytes or more of parallel data is inputted into the CRC encoding circuit 1, the CRC code of the parallel data can be generated easily.

The content of the description of this embodiment is a suitable example of the CRC encoding circuit in accordance with the present invention. The present invention is not limited to this.

For example, although the inputted variable-length data is explained as a 16-bytes parallel data in this embodiment, the present invention may be applied to $4^n$-byte parallel data, for example, 64-byte parallel data, by having n+1 of byte(s) parallel CRC encoders and n of serializer(s).

Furthermore, the CRC encoding circuit in accordance with the present invention, may be applied to a data sending device and a data receiving device. In this case, both of these devices generate a CRC code. Then, by making a comparison with each of the CRC codes, an error of data can be detected in the data communication.

In addition, with respect to the detailed composition of the CRC encoding circuit 1, the detailed operation of the CRC encoding circuit 1, or the like, various other changes may be suitably made without departing from the gist of the present invention.

The entire disclosure of Japanese Patent Application No. Tokugan 2000-359827 filed on Nov. 27, 2000 including specification, claims, drawings and summary are incorporated herein by reference in its entirety.

What is claimed is:

1. A CRC encoding circuit for generating a CRC code in accordance with a parallel data having a remainder portion data in a last data set of the parallel data, comprising:
   a first encoding unit for generating one or more first CRC codes in parallel in accordance with the remainder portion data;
   a CRC code selecting unit for selecting a second CRC code having predetermined number of bytes, from the first CRC codes generated by the first encoding unit;
   a converting unit for converting the remainder portion data into a serial data; and
   a second encoding unit for generating a third CRC code in accordance with the second CRC code selected by the CRC code selecting unit and the serial data converted by the converting unit.

2. The CRC encoding circuit as claimed in claim 1, wherein the parallel data is a $4^n$-byte parallel data, the predetermined number is $4^{n-m}$, and the converting unit converts the remainder portion data into a 4-byte serial data, where n is a natural number and m is a natural number selected from 1 to n.

3. The CRC encoding circuit as claimed in claim 1, further comprising:
   a detecting unit for detecting the remainder portion data from the last data set of the parallel data; and
   wherein the converting unit converts the remainder portion data which is detected by the detecting unit, into a $4^{n-m}$-byte serial data, where n is a natural number and m is a natural number selected from 1 to n.

4. The CRC encoding circuit as claimed in claim 1, wherein the parallel data is a variable-length data.

5. A CRC encoding method for generating a CRC code in accordance with a parallel data having a remainder portion data in a last data set of the parallel data, comprising the steps of:

generating one or more first CRC codes in parallel in accordance with the remainder portion data;

selecting a second CRC code having predetermined number of bytes, from the first CRC codes;

converting the remainder portion of the parallel data into a serial data; and generating a third CRC code in accordance with the second CRC code and the serial data.

6. The CRC encoding method as claimed in claim 5, wherein the parallel data is a $4^n$-byte parallel data, the predetermined number is $4^{n-m}$, and the serial data is a 4-byte serial data, where n is a natural number and m is a natural number selected from 1 to n.

7. The CRC encoding method as claimed in claim 5, further comprising the step of:

detecting the remainder potion data from the last data set of the parallel data;

wherein the remainder portion data is converted into a $4^{n-m}$-byte serial data, where n is a natural number and m is a natural number selected from 1 to n.

8. The CRC encoding method as claimed in claim 5, wherein the parallel data is a variable-length data.

9. A data sending device, comprising:

a CRC encoding circuit for generating a CRC code in accordance with a parallel data having a remainder portion data in a last data set of the parallel data, comprising: a first encoding unit for generating one or more first CRC codes in parallel in accordance with the remainder portion data; a CRC code selecting unit for selecting a second CRC code having predetermined number of bytes, from the first CRC codes generated by the first encoding unit; a converting unit for converting the remainder portion data into a serial data; and a second encoding unit for generating a third CRC code in accordance with the second CRC code selected by the selecting unit and the serial data converted by the converting unit.

10. The data sending device as claimed in claim 9, wherein the parallel data is a $4^n$-byte parallel data, the predetermined number is $4^{n-m}$, and the converting unit converts the remainder portion data into a 4-byte serial data, where n is a natural number and m is a natural number selected from 1 to n.

11. The data sending device as claimed in claim 9, wherein the CRC encoding circuit further comprises:

a detecting unit for detecting the remainder portion data from the last data set of the parallel data;

wherein the converting unit converts the remainder portion data which is detected by the detecting unit, into a $4^{n-m}$-byte serial data, where n is a natural number and m is a natural number selected from 1 to n.

12. The data sending device as claimed in claim 9, the parallel data is a variable-length data.

13. A data receiving device, comprising:

a CRC encoding circuit for generating a CRC code in accordance with a parallel data having a remainder portion data in a last data set of the parallel data, comprising: a first encoding unit for generating one or more first CRC codes in parallel in accordance with the remainder portion data; a CRC code selecting unit for selecting a second CRC code having predetermined number of bytes, from the first CRC codes generated by the first encoding unit; a converting unit for converting the remainder portion data into a serial data; and a second encoding unit for generating a third CRC code in accordance with the second CRC code selected by the selecting unit and the serial data converted by the converting unit.

14. The data receiving device as claimed in claim 13, wherein the parallel data is a $4^n$-byte parallel data, the predetermined number is $4^{n-m}$, and the converting unit converts the remainder portion data into a 4-byte serial data, where n is a natural number and m is a natural number selected from 1 to n.

15. The data receiving device as claimed in claim 13, wherein the CRC encoding circuit further comprises:

a detecting unit for detecting the remainder portion data from the last data set of the parallel data;

wherein the converting unit converts the remainder portion data which is detected by the detecting unit, into a $4^{n-m}$-byte serial data, where n is a natural number and m is a natural number selected from 1 to n.

16. The data receiving device as claimed in claim 13, the parallel data is a variable-length data.

* * * * *